United States Patent [19]

Kotachi et al.

[11] Patent Number: 5,192,643
[45] Date of Patent: Mar. 9, 1993

[54] PATTERN-FORMING METHOD AND RADIATION RESIST FOR USE WHEN WORKING THIS PATTERN-FORMING METHOD

[75] Inventors: Akiko Kotachi, Yokohama; Satoshi Takechi, Machida, both of Japan

[73] Assignee: Fujitsu Limited, Kawasaki, Japan

[21] Appl. No.: 643,960

[22] Filed: Jan. 22, 1991

[30] Foreign Application Priority Data

Jan. 24, 1990 [JP] Japan .................. 2-012640

[51] Int. Cl.⁵ .................. G03C 5/00; G03F 7/075
[52] U.S. Cl. .................. 430/296; 430/270; 430/942
[58] Field of Search .................. 430/270, 296, 942

[56] References Cited

U.S. PATENT DOCUMENTS 4,686,168  8/1987  Fujii .................. 430/296

FOREIGN PATENT DOCUMENTS 0271708  6/1988  European Pat. Off. .
0379173  7/1990  European Pat. Off. .......... 430/270
2239251  9/1990  Japan .................. 430/270

OTHER PUBLICATIONS

Patent Abstracts of Japan, vol. 12, No. 95 (P-681)(2942), Mar. 29, 1988 & JP-A-62 229141.
Patent Abstracts of Japan, vol. 9, No. 62 (P-342)(1785), Mar. 19, 1985 & JP-A-59 197036.
"Si-Containing Electron Resist Materials for Bilayer Processing Technology", Tada et al., Solid State Technology, Jun. 1989, pp. 91-95.

Primary Examiner—Marion E. McCamish
Assistant Examiner—Kathleen Duda
Attorney, Agent, or Firm—Armstrong, Westerman, Hattori, McLeland & Naughton

[57] ABSTRACT

Disclosed is a method of forming a pattern by irradiating a resist, which comprises irradiating a resist composed mainly of a polymer or copolymer comprising structural units represented by the following general formula (1):

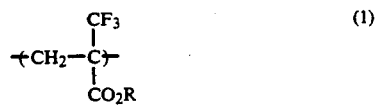

where R represents a hydrocarbon group containing at least one Si atom, patternwise with an energy beam, and developing the irradiated resist pattern.

6 Claims, 2 Drawing Sheets

PATTERN-FORMING METHOD AND RADIATION RESIST FOR USE WHEN WORKING THIS PATTERN-FORMING METHOD

BACKGROUND OF THE INVENTION

1. Field of the Invention

The present invention relates to a pattern-forming method, and to a radiation resist for use when working this pattern-forming method.

2. Description of the Related Art

Due to the recent increase of the degree of integration of semiconductor integrated circuits, it has become difficult to uniformly cover with a resist undulations formed at the multi-layer wiring operation, and accordingly, the utilization of the multi-layer resist method using a flattening layer as the lower layer has been attempted. To practically work this method, however, a resist having an excellent resistance to oxygen plasma etching, a high sensitivity, and an excellent resolving power must be developed.

Nevertheless, a positive resist having a practically sufficient performance as the upper layer resist of a two-layer resist for use in the electron beam lithography has not been developed although, as a positive resist having a good resistance to oxygen plasma etching, there have been proposed a poly[trimethylsilylmethyl-(α-chloro)methacrylate] having a structure represented by the following formula (3):

wherein Me represents —$CH_3$; the same will apply hereinafter, and poly(trimethylsilylmethyl methacrylate) represented by the following formula (4):

(see, for example, T. Tada and T. Ushirogouchi, Solid State Technology, June 1989, pages 91 through 95). In the case of the former resist, a high-sensitivity positive pattern can be obtained in a region of small irradiation doses by electron beam exposure, but at an irradiation dose larger than about 100 $\mu C/cm^2$, a negative pattern is formed, and accordingly, the region wherein the compound can be used as the positive resist is very narrow. The latter resist does not have a stable resolution sufficient for the resolving of a sub-micron pattern.

Accordingly, the present inventors investigated a copolymer of trimethylsilylmethyl methacrylate with 2,2,2-trifluoroethyl(α-trifluoromethyl) acrylate, which is represented by the following formula (5):

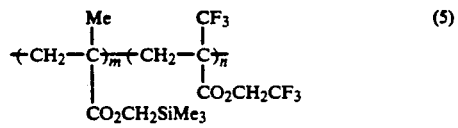

and a composition formed by adding an azide compound to this copolymer, to improve the resolution. Although these resists can resolve a sub-micron pattern, the sharpness of the pattern is relatively poor and the resistance to oxygen plasma etching is only slightly higher than the practically allowable lower limit (the selection ratio to the lower layer is 20).

Accordingly, if the polymer of formula (3) is used as the upper layer resist, there is a danger that a negative pattern will be formed in a beam-doubled portion at the electron beam exposing, and if the polymer of formula (4) or (5) is used, the sharpness of the pattern is poor and the transfer of the pattern to the lower layer is not complete.

SUMMARY OF THE INVENTION

Therefore, a primary object of the present invention is to provide a radiation resist having a very high resistance to oxygen plasma etching and able to easily resolve a sub-micron pattern without conversion to a negative pattern, and a pattern-forming method using this radiation resist.

In accordance with the present invention, this object can be attained by a method of forming a pattern by irradiating a resist, which comprises irradiating a resist composed mainly of a polymer or copolymer comprising structural units represented by the following general formula (1):

wherein R represents a hydrocarbon group containing at least one Si atom,
patternwise with an energy beam, and developing the irradiated resist pattern.

Furthermore, in accordance with the present invention, there is provided a radiation resist composed mainly of a polymer or copolymer comprising structural units represented by the above-mentioned formula (1).

DESCRIPTION OF THE PREFERRED EMBODIMENTS

Figure 1A:
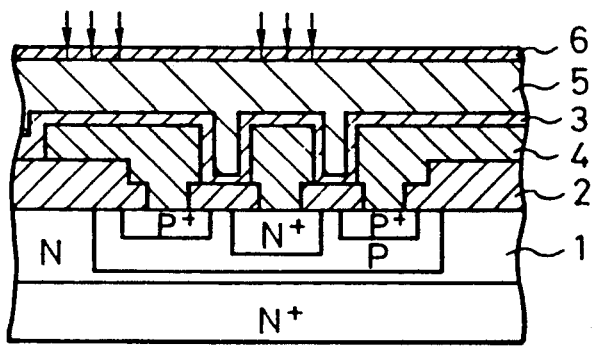
FIGS. 1a through 1d are diagrams illustrating in section the pattern-forming process according to the two-layer resist method; and, FIG. 2 is a diagram illustrating the sensitivity curve obtained in one example of the present invention.
Figure 1B:
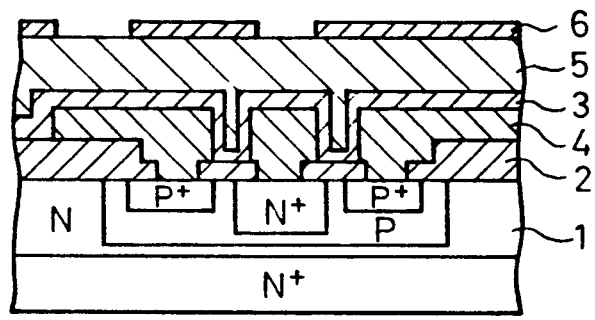
Figure 1C:
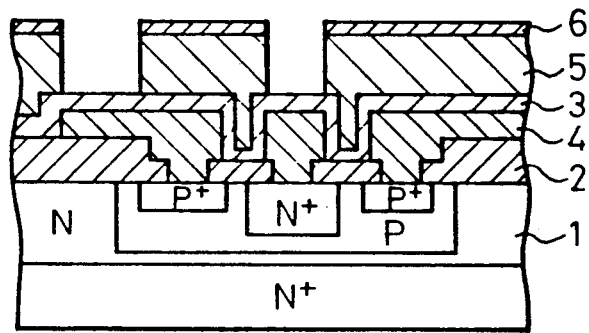

The polymer or copolymer used in the present invention preferably has a molecular weight of 30,000 to 10,000,000, more preferably 100,000 to 8,000,000.

As examples of the hydrocarbon group R in formula (1), the following groups can be mentioned.

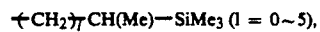

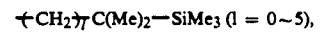

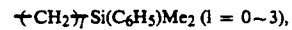

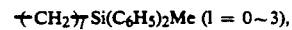

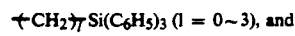

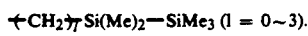

The resist material of the present invention has a high sensitivity, does not allow a conversion to a negative pattern. This is because, in the polymer or copolymer constituting the resist material, the main chain is easily decomposed by exposure to electron beams and is cured to be crosslinked, due to the trifluoromethyl is introduced into the α-position of the acrylic acid ester.

As the copolymer, there can be mentioned copolymers represented by the following structural formula (2):

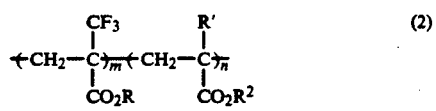

wherein R represents a hydrocarbon group containing at least one Si atom, R' represents $-CH_3$, $-CF_3$, a halogen atom, $-CN$, $-CH_2OH-$ or $-CH_2COOR^3$ (in which $R^3$ represents an alkyl or halogenoalkyl group having 1 to 10 carbon atoms, or a hydrogen atom), and $R^2$ represents an alkyl or halogenoalkyl group having 1 to 10 carbon atoms, or a hydrogen atom, with the proviso that $R^2$ and $R^3$ may be the same or different. and copolymers comprising α-methylstyrene, a derivative thereof, α-chloroacrylonitrile, methacrylonitrile or the like as the other monomers. Note, the copolymers that can be used in this invention are not limited to those exemplified above.

As described above, the known positive resist represented by formula (3) forms a negative pattern at an electron beam irradiation dose larger than about 100 $\mu C/cm^2$, as is obvious from FIG. 3 on page 92 of the above-mentioned literature reference, Solid State Technology, June 1989. In contrast, the radiation resist of the present invention does not form a negative pattern even if the electron beam irradiation dose is larger than 100 $\mu C/cm^2$ and the resist does not form a negative pattern at least up to an electron beam irradiation dose of 1000 $\mu C/cm^2$. This means that, even if the resist is irradiated with electron beams in an unnecessary large dose, a desired positive pattern is always formed. Accordingly, the resist of the present invention is very advantageous for obtaining a uniform irradiation with radiations.

One embodiment of the pattern-forming method of the present invention will now be described with reference to the accompanying drawings.

FIGS. 1a through 1d are sectional diagrams illustrating the pattern forming process utilizing the two-layer resist method, wherein oxide films 2 and 3 and an aluminum wiring 4 are formed on a semiconductor substrate 1, and a planarizing layer (lower resist layer) 5 is formed for planarizing undulations formed on the surface by the wiring. A layer (upper resist layer) 6 composed of the positive resist of the present invention is formed on the planarizing layer 5.

Figure 1D:
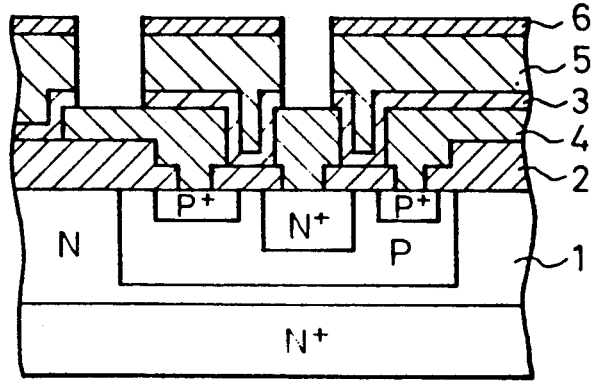

For example, electron beams are applied patternwise through a mask from above the positive resist layer 6 (FIG. 1a), the upper resist layer 6 is developed to form a resist pattern (FIG. 1b), $O_2$ RIE etching is carried out to etch the lower resist layer 5 (FIG. 1c), and the substrate is then etched by RIE or a halogen gas to form contact holes (FIG. 1d). Usually, the resist is stripped after the formation of the contact holes.

The radiation resist of the present invention has a very high resistance to oxygen plasma etching, and therefore, the radiation resist of the present invention can be advantageously used not only as the upper layer resist in the above-mentioned multi-layer resist method but also as the single layer resist.

The above-mentioned polymer or copolymer of the present invention can be prepared by the anion polymerization using an alkali metal alkoxide as the initiator and a crown ether as the cation complexing agent.

As illustrated in examples given hereinafter, a positive pattern having a very high dimensional precision can be formed according to the present invention.

The present invention will now be described in detail with reference to the following examples, that by no means limit the scope of the invention.

EXAMPLE 1

A tetrahydrofuran (THF) solution containing 64.5 g/l of 18-crown-6 recrystallized and purified by using a THF solution containing 2.1 g/l of potassium t-butoxide purified by sublimation under a reduced pressure was prepared. A reaction vessel having the inner atmosphere substituted with nitrogen was charged with 18 ml of distilled anhydrous THF, 4.0 g of trimethylsilylmethyl(α-trifluoromethyl) acrylate, and 36 ml of the THF solution of 18-crown-6 (containing 2.34 mg of 18-crown-6), the mixture was cooled to $-78°$ C., 470 μl of a THF solution of potassium t-butoxide (containing 0.96 mg of potassium t-butoxide) was added dropwise to the mixture with stirring, and the mixture was maintained at $-78°$ C. for 24 hours. Then, the temperature was elevated to room temperature, the reaction vessel was opened, and the obtained viscous polymer solution was diluted with THF and poured into a large quantity of methanol. Thereafter, the precipitated polymer was dried under a reduced pressure to obtain 3.2 g (the yield was 80%) of a polymer represented by the following formula (7):

The weight average molecular weight (Mw) of this polymer was 1,340,000.

EXAMPLE 2

The procedures of Example 1 were repeated in the same manner except that trimethylsilylethyl(α-trifluoromethyl) acrylate was used as the monomer, whereby a polymer (Mw=280,000) represented by the following formula (8) was obtained in a yield of 50.5%:

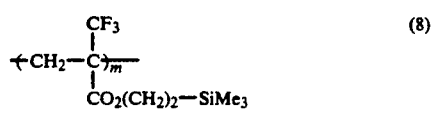

EXAMPLE 3

The procedures of Example 1 were repeated in the same manner except that trimethylsilylethyl(α-trifluoromethyl) acrylate and methyl methacrylate were used as a molar ratio of 1/1 as the monomers, whereby a polymer (Mw=500,000, m/n=46/54) represented by the following formula (9) was obtained in a yield of 35.5%:

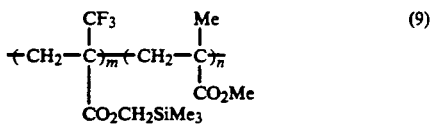

EXAMPLE 4

Figure 2:
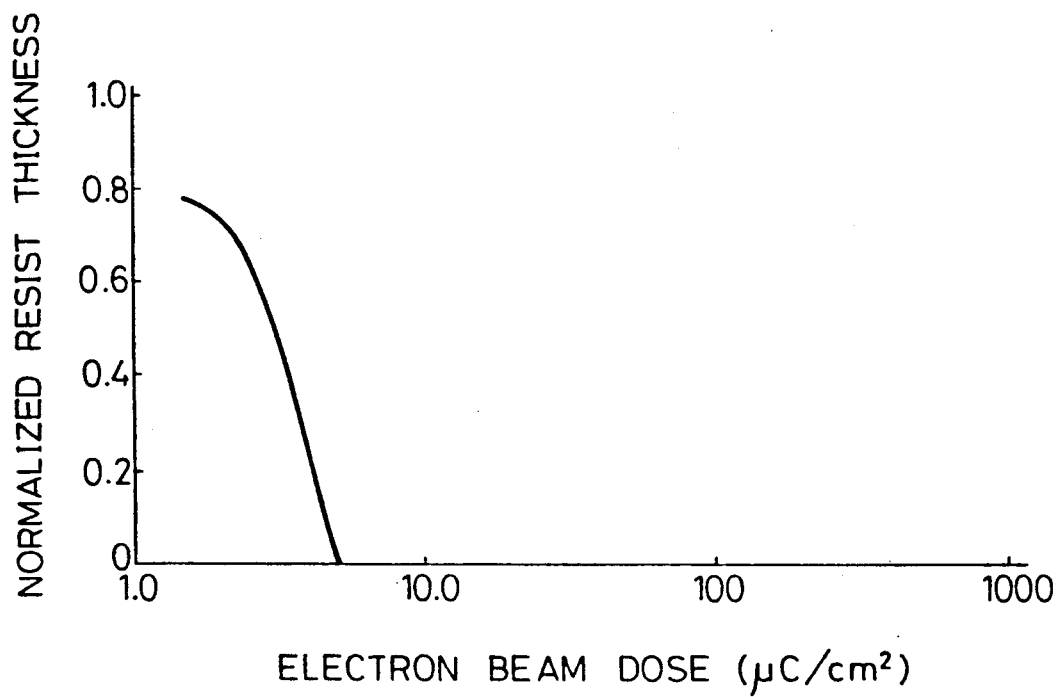

The polymer of formula (7) was coated in a thickness of 3000 Å on a silicon wafer and baked at 180° C. for 30 minutes in an oven. The polymer was then exposed with electron beams under an acceleration voltage of 20 KeV in a dose of from 1.6 to 1000 $\mu C/cm^2$, while increasing the dose at a pitch of 1.6 $\mu C/cm^2$ and thereafter developed in 1-heptanol for 7 minutes. Positive patterns were obtained. The obtained sensitivity curve is shown in FIG. 2.

COMPARATIVE EXAMPLE 1

When the polymer of formula (3) was used, a negative pattern was formed in an electron beam dose exceeding 100 $\mu C/cm^2$, as is well-known in the art.

EXAMPLE 5

The polymer of formula (7) was coated in a thickness of 3000 Å on a silicon wafer and was then baked at 180° C. for 30 minutes. The polymer was irradiated with electron beams through line-&-space patterns, and the development was carried out in the same manner as described in Example 4. The line-&-space patterns of 0.4 $\mu m$ could be resolved, and the shape of the pattern was very sharp.

COMPARATIVE EXAMPLE 2

The procedures of Example 5 were repeated in the same manner except that the polymer of formula (4) was used. The line-&-space patterns of 2 $\mu m$ could be resolved, and the edge of the shape of the resolved pattern was tapering. When the polymer of formula (5) was used, the line-&-space patterns of 0.75 $\mu m$ could be resolved. When 5% of 4,4'-diazidochalcone represented by the following formula (6):

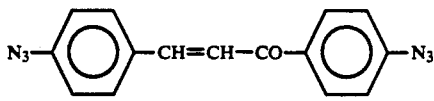

was added to the polymer of formula (5) and heat cross-linking was effected by baking at 130° C., the line-&-space patterns of 0.5 $\mu m$ could be resolved, but the pattern shape was inferior to that obtained in Example 5.

EXAMPLE 6

The polymer of formula (7) was coated in a thickness of 3000 Å on a silicon wafer and oxygen plasma etching (O$_2$RIE) was carried out under conditions of 300 W, 0.03 Torr and 100 sccm. The film thickness-reducing rate was 120 Å/min. This rate was about 1/38 of the rate of OFPR (novolak resist supplied by Tokyo Oka).

COMPARATIVE EXAMPLE 3

The procedures of Example 6 were repeated in the same manner except that the polymer of formula (5) was used. Note, even where an optimum pattern shape was obtained, the etching rate was 1/20 of the rate of OFPR.

EXAMPLE 7

The polymer of formula (8) was coated in a thickness of 3000 Å on a silicon wafer and was then baked at 180° C. for 30 minutes. The coating was exposed to electron beams through line-&-space pattern and was then developed in 1-octanol for 2 minutes. The line-&-space pattern of 0.5 $\mu m$ could be resolved. When the patterns were subjected to O$_2$RIE under the same conditions as described in Example 6, the etching rate was about 1/30 of the rate of OFPR.

EXAMPLE 8

The polymer of formula (9) was coated in a thickness of 3000 Å on a silicon wafer and baked at 180° C. for 30 minutes in an oven, and the coating was exposed to electron beams through a line-&-space pattern and developed in nitromethane/nitroethane (50/1) for 5 minutes. The line-&-space patterns of 0.75 $\mu m$ could be resolved. When O$_2$RIE was carried out under the same conditions as described in Example 6, the etching rate was about 1/22 of the rate of OFPR.

EXAMPLES 9 THROUGH 12

When the procedures of Examples 4, 5, 7 and 8 were repeated in the same manner, except that X-rays were used instead of electron beams, similar results were obtained.

EXAMPLE 13

OFPR was coated in a thickness of 2 $\mu m$ as the lower layer material on a silicon wafer and baked at 200° C. for 1 hour. The polymer of formula (7) was coated in a thickness of 3000 Å on the lower layer and baked at 180° C. for 30 minutes. Then, the exposure to electron beams was carried out under an acceleration voltage of 20 KeV in a dose of 9.6 $\mu C/cm^2$ through line-&-space pattern of 0.5 $\mu m$, and developed in 1-heptanol for 7 minutes. When oxygen plasma etching (O$_2$RIE) was carried out under conditions of 300 W, 0.03 Torr and 100 sccm for 5 minutes, a pattern having a good shape could be obtained. The upper layer could sufficiently resist etching of 2 $\mu m$ of the lower layer.

EXAMPLE 14

The procedures of Example 13 were repeated in the same manner except that the polymer of formula (8) was used instead of the polymer of formula (7). Line-&-space patterns of 0.5 $\mu m$ could be resolved with a good shape. The irradiation dose was 14.4 $\mu C/cm^2$.

EXAMPLE 15

The procedures of Example 13 were repeated in the same manner except that the polymer of formula (9) was used instead of the polymer of formula (7). Line-&-space patterns of 0.75 $\mu m$ could be resolved with a good shape. The irradiation dose was 19.6 $\mu C/cm^2$.

We claim:
1. A pattern-forming method, which comprises irradiating a positive resist composed mainly of a polymer or copolymer comprising structural units represented by the following formula (1):

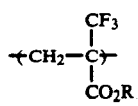

wherein R represents a hydrocarbon group containing a substituent with at least one Si atom,
patternwise with an energy beam, and developing the irradiated resist pattern.

2. A pattern-forming method according to claim 1, wherein the polymer or copolymer has a molecular weight of 30,000 to 10,000,000.

3. A pattern-forming method according to claim 1, wherein the hydrocarbon group R in formula (1) is selected from the following groups:

$+CH_2 \rightarrow_l SiMe_3 \; (l = 0\sim5)$, $+CH_2 \rightarrow_l CH(Me)-SiMe_3 \; (l = 0\sim5)$, $+CH_2 \rightarrow_l C(Me)_2-SiMe_3 \; (l = 0\sim5)$, $+CH_2 \rightarrow_l Si(C_6H_5)Me_2 \; (l = 0\sim3)$, $+CH_2 \rightarrow_l Si(C_6H_5)_2Me \; (l = 0\sim3)$, $+CH_2 \rightarrow_l Si(C_6H_5)_3 \; (l = 0\sim3)$, and -continued $+CH_2 \rightarrow_l Si(Me)_2-SiMe_3 \; (l = 0\sim3)$.

4. A pattern-forming method according to claim 1, wherein the energy beam is an electron beam.

5. A pattern-forming method according to claim 1, wherein the copolymer comprising structural units is a copolymer represented by the following structural formula (2):

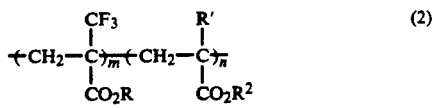

wherein R represents a hydrocarbon group containing a substituent with at least one Si atom, R' represents $-CH_3$, $-CF_3$, a halogen atom, $-CN$, $-CH_2OH-$ or $-CH_2COOR^3$ (in which $R^3$ represents and alkyl or halogenoalkyl group having 1 to 10 carbon atoms, or a hydrogen atom), and $R^2$ represents an alkyl or halogenoalkyl group having 1 to 10 carbon atoms, or a hydrogen atom, with the proviso that $R^2$ and $R^3$ may be the same or different.

6. A pattern-forming method according to claim 5, wherein the copolymer further comprises a monomer selected from the group consisting of α-methylstyrene, a derivative thereof, α-chloroacrylonitrile and methacrylonitrile.

* * * * *